(12) United States Patent
Nishikawa et al.

(10) Patent No.: US 8,242,773 B2
(45) Date of Patent: Aug. 14, 2012

(54) VEHICLE SWITCH

(75) Inventors: Hisashi Nishikawa, Shiga (JP); Naoki Yoshikawa, Fukui (JP)

(73) Assignee: Panasonic Corporation, Osaka (JP)

( * ) Notice: Subject to any disclaimer, the term of this patent is extended or adjusted under 35 U.S.C. 154(b) by 505 days.

(21) Appl. No.: 12/272,884

(22) Filed: Nov. 18, 2008

(65) Prior Publication Data
US 2009/0128140 A1     May 21, 2009

(30) Foreign Application Priority Data
Nov. 19, 2007   (JP) .................................. 2007-299010

(51) Int. Cl.
*G01B 7/14* (2006.01)

(52) U.S. Cl. ............ 324/207.24; 324/207.2; 324/207.21
(58) Field of Classification Search ............... 324/207.2, 324/207.21, 207.23, 207.24, 207.25; 361/825
See application file for complete search history.

(56) References Cited

U.S. PATENT DOCUMENTS

| | | | | |
|---|---|---|---|---|
| 5,570,015 A | * | 10/1996 | Takaishi et al. | .......... 324/207.21 |
| 5,714,728 A | | 2/1998 | Garneyer et al. | |
| 6,362,978 B1 | * | 3/2002 | Boe | ............................... 361/825 |

FOREIGN PATENT DOCUMENTS

| | | |
|---|---|---|
| JP | 9-97549 A | 4/1997 |
| JP | 2006-092777 A | 4/2006 |

* cited by examiner

*Primary Examiner* — Jay Patidar
(74) *Attorney, Agent, or Firm* — RatnerPrestia (57) ABSTRACT

A holder is disposed in the case. The holder is mounted with an actuator that moves in the predetermined direction and a wiring board having a detector. A positioning mechanism between relevant components for detecting the positions of components is provided such as a wiring board and a holder, the position of magnet in particular. In this way, the magnet and the detector opposing to each other are positioned. As a result, when a vehicle switch is assembled, the variation in position of the magnet and detector is reduced.

1 Claim, 8 Drawing Sheets

VEHICLE SWITCH

BACKGROUND OF THE INVENTION

1. Field of the Invention

The present invention relates to a vehicle switch used for turning a stop lamp on/off for example when a brake pedal of a motor vehicle is operated in particular.

2. Background Art

Recently, a pressure type switch is used as a vehicle switch for transmitting the operation of a brake pedal to a controller. When the operation of the brake pedal depressed is transmitted, the controller serves to turn on a stop lamp. With the brake pedal released, the controller serves to turn off the stop lamp.

Figure 7:
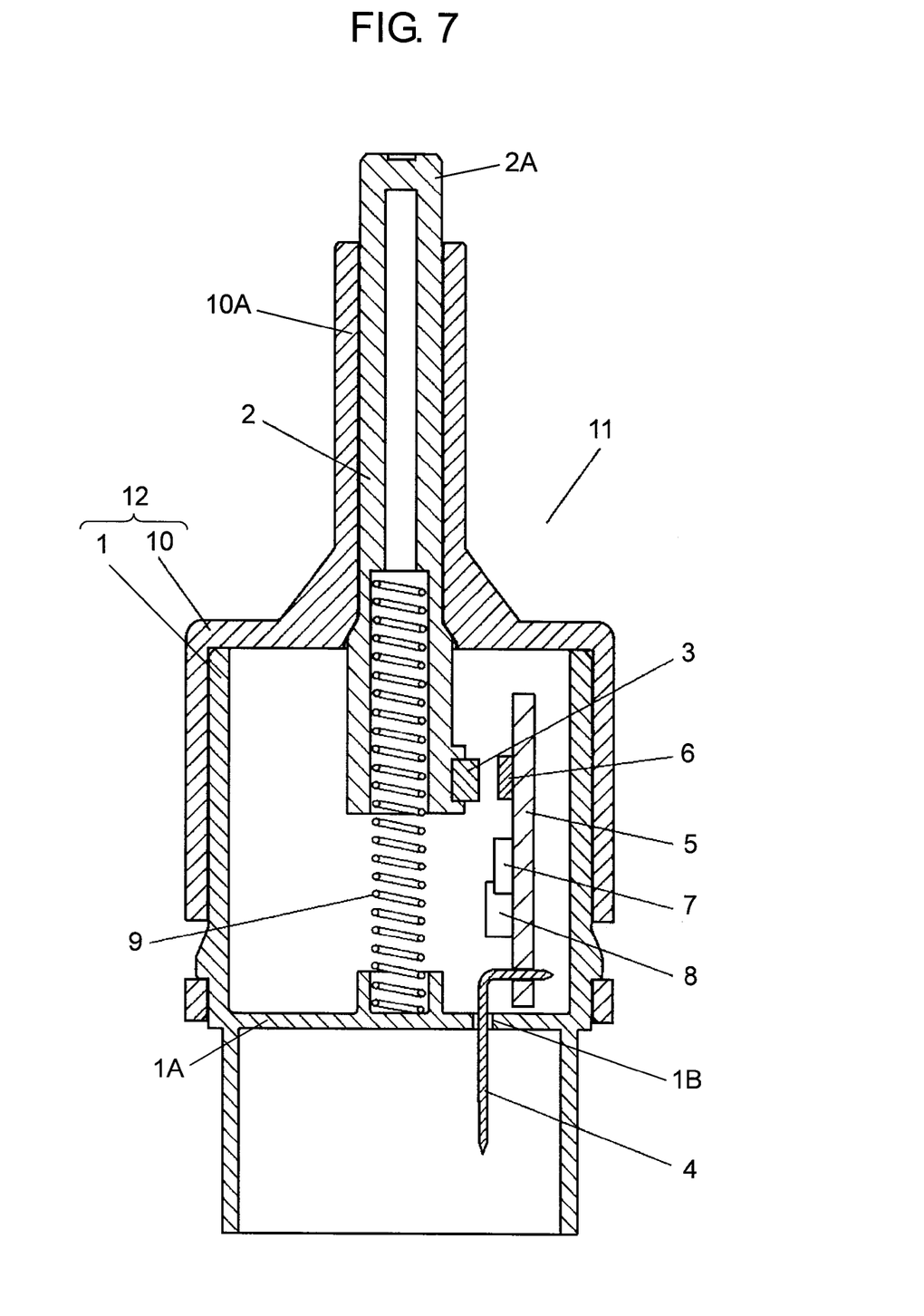
FIG. 7 is a sectional view of a conventional vehicle switch.

Such a conventional vehicle switch is described with reference to FIG. 7 and FIG. 8. FIG. 7 is a sectional view of conventional vehicle switch 11. In the figure, casing 12 includes case 1 and cover 10. Case 1 is made of insulating resin and opens upward in the figure. Cover 10 is made of insulating resin and disposed so as to cover the opening of case 1. Tube 10A is disposed at the upper part of cover 10. Actuator 2 and spring 9 are disposed in casing 12. Actuator 2 is installed in such manner as to be vertically movable in tube 10A. In the figure, coil spring 9 is disposed between a hollow portion of actuator 2 and bottom 1A of case 1. Due to restoring force of spring 9, actuator 2 is pressed against cover 10. End 2A of actuator 2 is protruded upward from tube 10A.

Casing 12 is internally provided with magnet 3 and detector 6 in such manner as to be opposed to each other. Magnet 3 is disposed on the lower side surface of actuator 2. Detector 6 is formed of Hall Element and the like and disposed on wiring board 5. On wiring board 5 are disposed switching part 7 such as transistor or the like, and controller 8 formed of FET and a plurality of fixed resistors, etc. As to a plurality of terminals 4 made of conductive metal, one end thereof is connected to wiring board 5, and the other end is protruded outside the casing 12 from hole 1B of bottom 1A. Wiring patterns are provided on the right and left surfaces of wiring board 5. Terminal 4, detector 6, switching part 7, and controller 8 are electrically connected via the wiring patterns. These electronic parts are electrically connected by using solder or the like.

Figure 8:
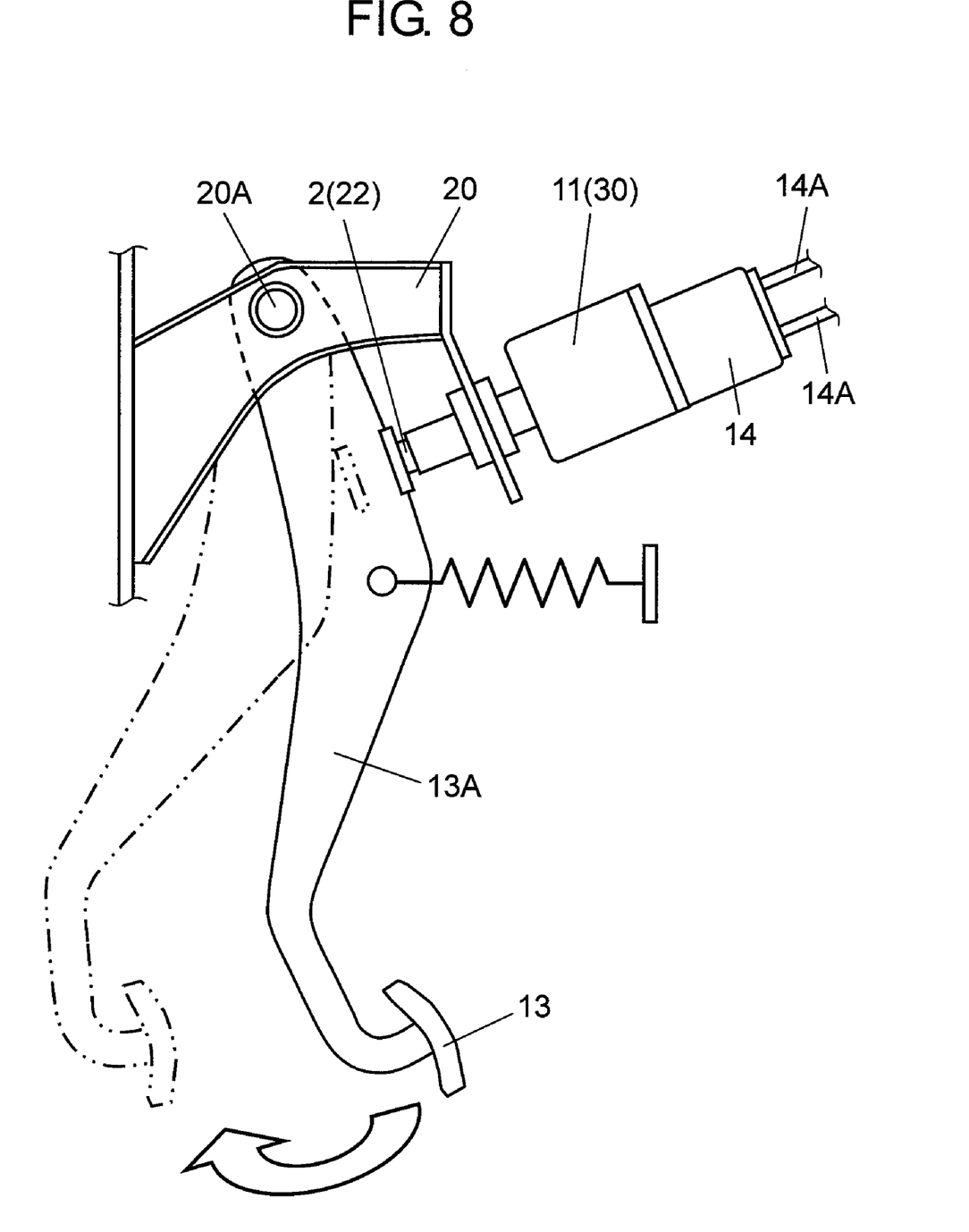
FIG. 8 is a side view of an essential portion of a conventional brake pedal.

FIG. 8 shows a state of above-mentioned vehicle switch 11 mounted in a motor vehicle. Vehicle switch 11 and arm 13A are fitted in holding member 20. Arm 13A and holding member 20 are connected to each other on fulcrum 20A of arm 13A. Brake pedal 13 is attached to the tip of arm 13A. Arm 13A and vehicle switch 11 are in contact with each other via the end 2A of actuator 2. Connector 14 is connected to vehicle switch 11. Terminal 4 shown in FIG. 7 connects to a stop lamp and ignition switch of the motor vehicle, battery, electronic circuits of the motor vehicle, etc. via lead wires 14A of connector 14.

In FIG. 8, the state of arm 13A and brake pedal 13 shown by solid line indicates a state obtained when brake pedal 13 is not depressed. The state of arm 13A and brake pedal 13 shown by broken line indicates a state obtained when brake pedal 13 is depressed.

In the case, vehicle switch 11 shown in FIG. 7 changes as described in the following when brake pedal 13 is depressed. When brake pedal 13 is not depressed, the pressing force is applied downward in FIG. 7 to the end 2A of actuator 2. In other words, actuator 2 is in a state of being pressed downward. Magnet 3 disposed on the side surface of actuator 2 moves downward along with actuator 2. When brake pedal 13 is depressed, magnet 3 confronted detector 6, and when brake pedal 13 is not depressed, magnet 3 is positioned far away from detector 6. Consequently, the magnetism of magnet 3 detected by detector 6 becomes very weak.

Controller 8 operates as follows in accordance with the intensity of magnetism detected by detector 6.

When the magnetism detected exceeds the specified value, controller 8 detects that vehicle switch 11 is turned on. As a result, controller 8 turns on switching part 7 and turns on the stop lamp. When the magnetism detected is less than the specified value, controller 8 detects that vehicle switch 11 is turned off. As a result, controller 8 turns off the switching part 7 and turns off the stop lamp.

As described above, with actuator 2 depressed downward, the magnetism detected by detector 6 is very weak, that is, the magnetism is less than the specified value. Accordingly, controller 8 detects that vehicle switch 11 is turned off, then it turns off the switching part 7 and turns off the stop lamp.

With brake pedal 13 is depressed, the inside of vehicle switch 11 shown in FIG. 7 becomes as described in the following. When brake pedal 13 is depressed, arm 13A moves apart from the end 2A of actuator 2. As a result, the pressing force applied to actuator 2 by means of arm 13A is released, and then, due to the restoring force of spring 9, actuator 2 is moved upward. The condition is shown in FIG. 7. At the time, magnet 3 disposed on the side surface of actuator 2 moves upward along with actuator 2. As a result, magnet 3 and detector 6 become opposed to each other, intensifying the magnetism of magnet 3 detected by detector 6. In other words, the magnetism detected by detector 6 becomes higher than the specified value, and controller 8 detects that vehicle switch 11 is turned on. And controller 8 turns on switching part 7 and turns on the stop lamp.

That is, conventional vehicle switch 11 operates as follows. Actuator 2 vertically moves in tube 10A in accordance with the operation of brake pedal 13. Magnet 3 disposed on the side surface of actuator 2 moves along with actuator 2. The magnetism detected by detector 6 varies in accordance with the movement of magnet 3. When the magnetism detected by detector 6 is higher than the specified value, controller 8 detects that vehicle switch 11 is turned on. When the magnetism detected by detector 6 is less than the specified value, controller 8 detects that vehicle switch 11 is turned off. In accordance with the detection result of controller 8, controller 8 turns on/off the switching part 7, and turns on/off the stop lamp. Accuracy of control for turning on/off the stop lamp depends upon accuracy of positional relations between magnet 3 and detector 6.

In the assembly process of vehicle switch 11, if the position of each part is deviated, there arise positional deviation between magnet 3 and detector 6. As a result, it gives rise to the occurrence of variation or error in detection accuracy of the movement of actuator 2 with respect to the detection by magnet 3 and detector 6. Specifically, the assembly process includes a step of mounting detector 6 on wiring board 5, a step of fixing wiring board 5 to case 1, a step of fitting magnet 3 to actuator 2, or a step of installing actuator 2 in casing 12.

As prior art, for example, Unexamined Japanese Patent Publication No. 2006-92777 is known.

Actuator 2 on which magnet 3 is fixed and wiring board 5 on which detector 6 is mounted are different parts. Since these parts are different from each other in material and manufacturing method, their allowable values are different with respect to variation in shape and size or positional deviation in assembly of each part. Accordingly, when switch 11 is assembled by using these parts, positional deviation may be sometimes generated between magnet 3 and detector 6. As a result, there arises variation or error in the accuracy of detecting the position of magnet 3 by using magnet 3 and detector 6.

SUMMARY OF THE INVENTION

A vehicle switch including, a casing, an actuator movable in a predetermined direction with respect to the casing, a magnet fixed to the actuator, a detector for detecting magnetism generated from the magnet, and a holder fixed to the casing, the holder enabling the actuator to move in the predetermined direction and positioning the detector.

By using such the vehicle switch, it is possible to reduce variation of their installing positions without any device or tool only for the positioning purpose in the assembly work.

DETAILED DESCRIPTION OF THE PREFERRED EMBODIMENTS

A vehicle switch in the first embodiment of the present invention will be described in the following with reference to the drawings.

The same components as those described in the background art are given same reference numerals, the contents of which are incorporated herein.

First Embodiment

Figure 1:
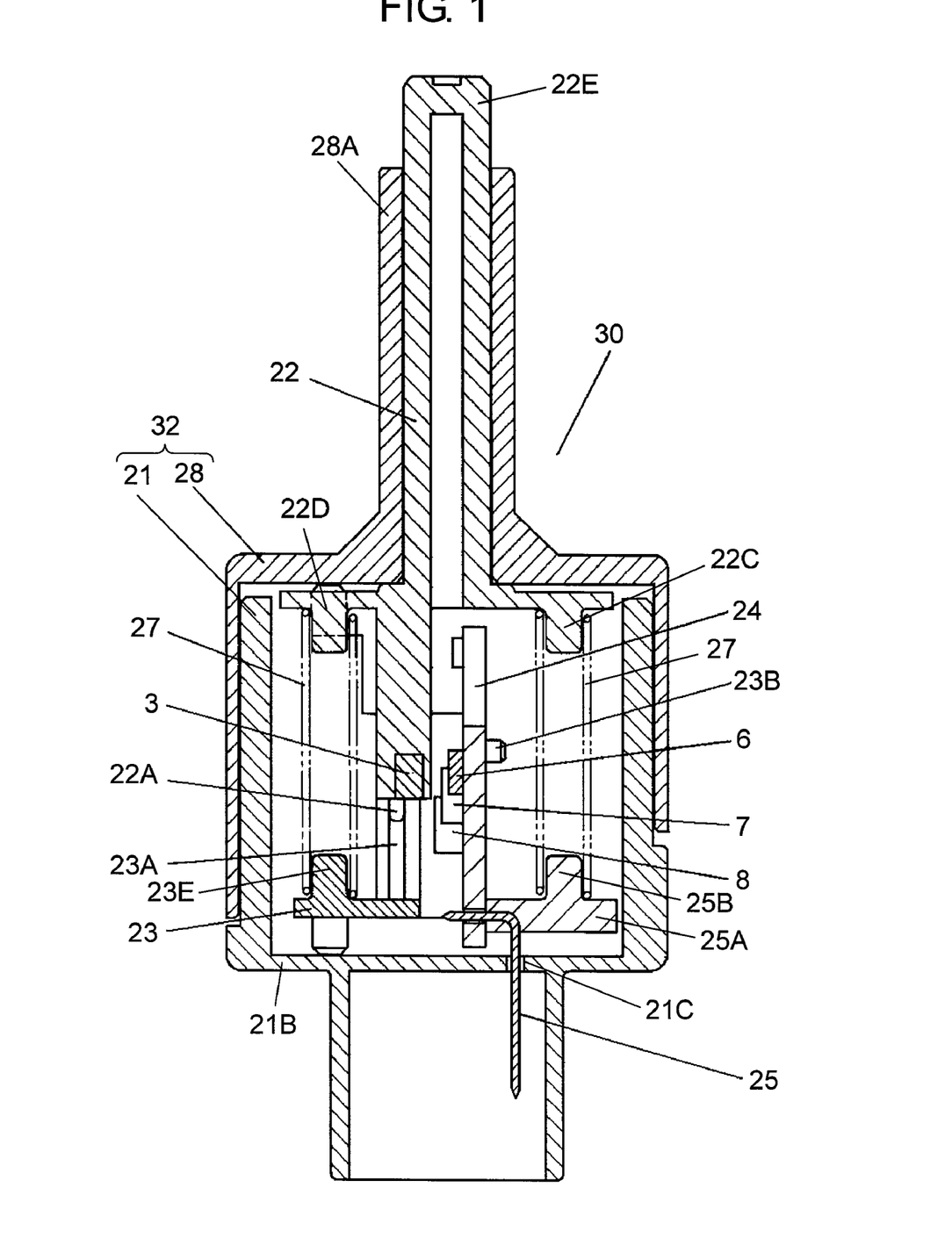
FIG. 1 is a sectional view of a vehicle switch in the first embodiment of the present invention.
Figure 2:
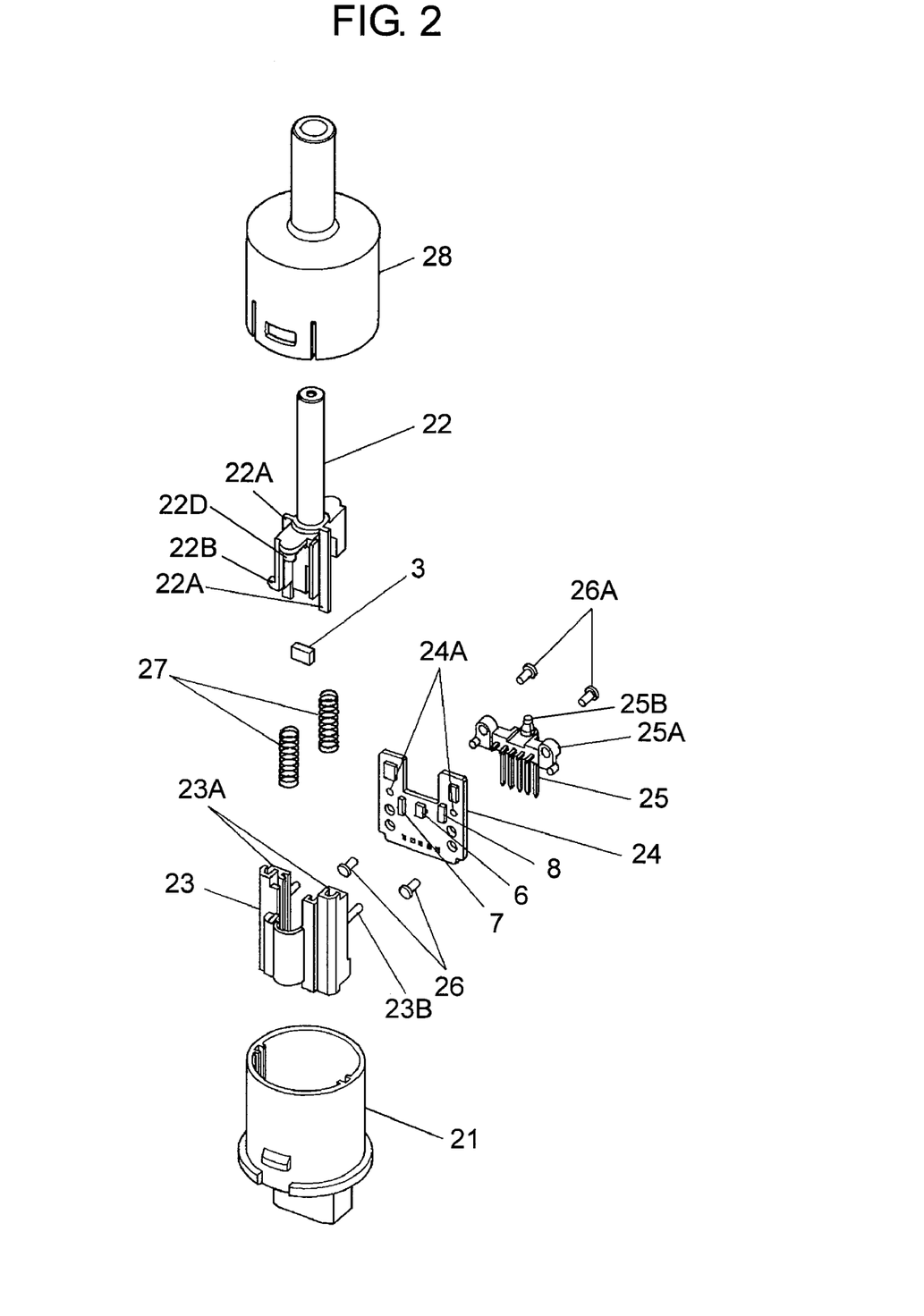
FIG. 2 is an exploded perspective view of a vehicle switch in the first embodiment of the present invention.
Figure 3A:
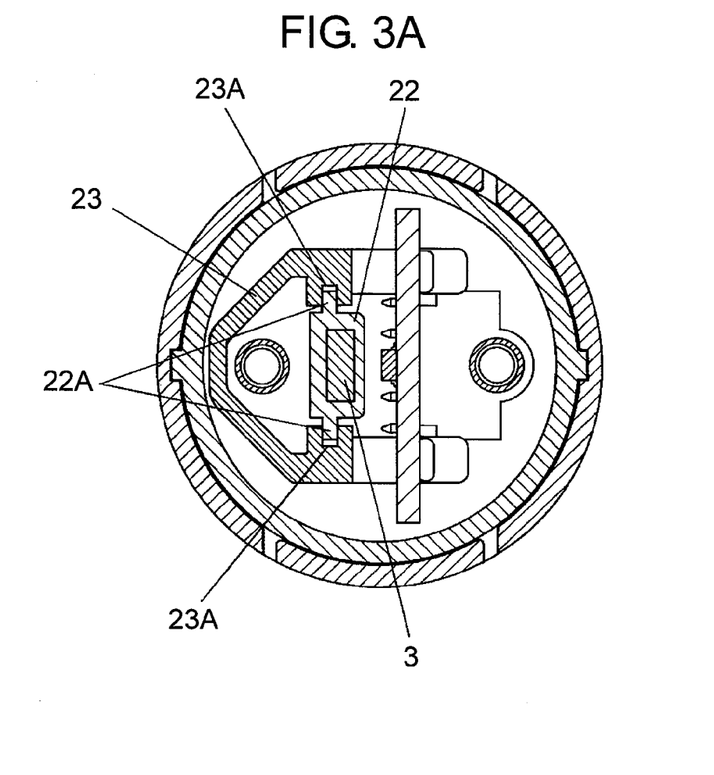
FIG. 3A is a sectional view of a vehicle switch in the first embodiment of the present invention.

FIG. 1 is a sectional view of a vehicle switch in the first embodiment of the present invention. FIG. 2 is an exploded perspective view in the first embodiment of the present invention. FIG. 3A is a sectional view of a vehicle switch in the first embodiment of the present invention. In FIG. 1 and FIG. 2, casing 32 is formed of case 21 and cover 28. Case 21 is made of insulating resin and opens upward in the figure. Cover 28 is made of insulating resin and disposed so as to cover the opening of case 21. As insulating resin, polybutylene terephthalate or ABS (Acrylonitrile Butadiene Styrene) or the like can be used. Tube 28A is disposed at the upper part of cover 28. Actuator 22, holder 23, and spring 27 are disposed in casing 32.

Actuator 22 is cylindrical and made of insulating resin such as terepolybutylene phthalate and ABS or the like. Actuator 22 is installed in such manner as to be vertically movable in tube 28A so that can move in the predetermined direction with respect to casing 32. A prescribed direction where actuator 22 moves with respect to casing 32 is called the predetermined direction. In the first embodiment of the present invention, actuator 22 moves the inside of tube 28A in the vertical direction in FIG. 1. That is, the vertical direction becomes the predetermined direction. The predetermined direction may satisfy the following conditions. Actuator 22 moves in a constant direction. It enters the state where detector 6 detects or not detect magnetism of magnet 3 according to the movement of actuator 22.

Plate-like slide 22A is provided on the side surface of actuator 22 along the predetermined direction. As shown in FIG. 3A, slide 22A is held so as to be movable in the predetermined direction by means of groove-like guide 23A disposed in holder 23. In more detail, slide 22A of which the sectional shape of actuator 22 is projection engages guide 23A of which the sectional shape of holder 23 is recess. Due to this structure, actuator 22 is held in the right and left directions. As a result, actuator 22 is able to move in the predetermined direction without deviation in the right and left directions. Magnet 3 is disposed under actuator 22.

Holder 23 is made of insulating resin the same as for actuator 22, and has guide 23A for the movement of actuator 22 in the predetermined direction. Slide 22A disposed on actuator 22 and guide 23A disposed on holder 23 may be reverse in position. That is, at the portion of each engagement, two slides are disposed on actuator 22 to make the sectional shape recess, while one guide is disposed on holder 23 to make the sectional shape projection. In this configuration, actuator 22 is able to move in the predetermined direction without deviation in the right and left directions. In the case of the structure shown in FIG. 3A, at the portion of each engagement, one slide 22A may be disposed on actuator 22, and it can be easily fitted in guide 23A disposed on holder 23, making it easier to assemble the parts.

Spring 27 is made of coiled steel wire. Spring 27 is just required to be resilient having restoring force and not required to be special with respect to the material and shape. In the first embodiment, two springs 27 are used. One of them is disposed between projection 25B of base 25A of terminal 25 and projection 22C of actuator 22. The other one is disposed between projection 23E at the bottom of holder 23 and projection 22D of actuator 22. The combination of these is shown in FIG. 1. Actuator 22 is pressed against cover 28 by the restoring force of spring 27. In this case, end 22E of actuator 22 is protruded upward from tube 28A as shown in the figure.

Also, casing 32 is internally provided with magnet 3 and detector 6 for detecting the position of magnet 3. Detector 6 is formed of Hall Elements, SMR Elements (Semiconductor MagnetoResistive Elements) or the like, and disposed on wiring board 24.

Switching part 7 such as transistors or the like, and controller 8 formed of FET and a plurality of fixed resistors, etc, are disposed on wiring board 24. As to a plurality of terminals 25 made of conductive metal such as copper alloy, one end thereof is connected to wiring board 24, and the other end is protruded outside the casing 32 from hole 21B of bottom 21A. Wiring patterns are provided on the right and left surfaces of wiring board 24. Terminal 25, detector 6, switching part 7, and controller 8 are electrically connected via the wiring patterns. These electronic parts are electrically connected by using solder or the like. Wiring board 24 is provided with two reference holes 24A. Reference hole 24A is configured with wiring patterns and shows the reference position for mounting the wiring board 24 on holder 23.

Terminal 25 is inserted in base 25A and is bent in the form of L-shape. Base 25A is made of insulating resin. Base 25A is fixed on wiring board 24 by means of screw 26.

The procedure for accurately mounting the wiring board 24 on holder 23 will be described in the following.

Figure 4A:
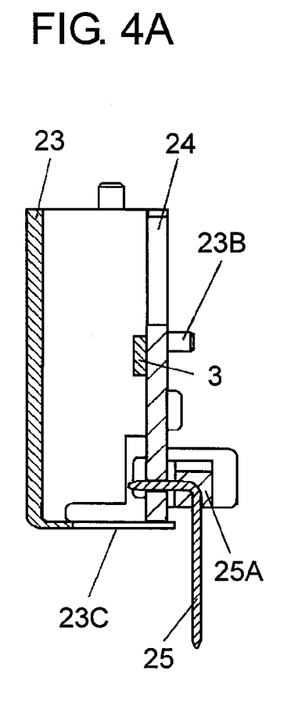
FIG. 4A is a sectional view of an essential portion of a vehicle switch in the first embodiment of the present invention.
Figure 4B:
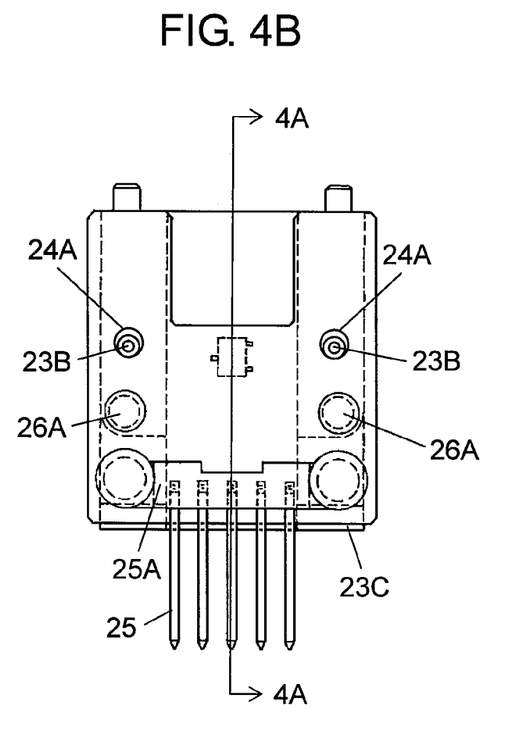
FIG. 4B is a front view of an essential portion of a vehicle switch in the first embodiment of the present invention.

As shown in FIG. 2, FIG. 4A and FIG. 4B, holder 23 is provided with two pins 23B and supporter 23C. When wiring board 24 is mounted on holder 23, the position is decided by pins 23B. In the first embodiment, pin 23B is cylindrical in shape.

As shown in FIG. 4A and FIG. 4B, pin 23B is inserted into reference hole 24A of wiring board 24. In this case, supporter 23C having restoring force pushes wiring board 24 upward. As a result, a part of reference hole 24A is pressed against the lower end of pin 23B. Thus, in the first embodiment, pin 23B is inserted into reference hole 24A, and by using the restoring force of supporter 23C, the mounting position is decided for holder 23 and wiring board 24. In this configuration, pin 23B can be tight pressed against reference hole 24A, and it is possible to accurately mount the wiring board 24 on holder 23. After that, wiring board 24 is fastened to holder 23 by using screw 26A.

In this way, the main parts of vehicle switch 30 are assembled.

The assembly process for vehicle switch 30 will be further specifically described in the following.

Cream solder is applied to a plurality of lands of wiring board 24. Electronic components such as controller 8, detector 6, and switching part 7 are mounted on these lands. After that, wiring board 24 is heated by means of a heating bath. The cream solder then heated melts and serves to electrically connect each land to each terminal of electronic component. Thereafter, base 25A having a plurality of terminals 25 is mounted and fixed on wiring board 24 by means of screw 26, and then, each terminal 25 is electrically connected to the land by using solder.

As for the electronic components, detector 6 in particular, the land is formed in same width as for the electrode or the terminal of the electronic component itself. In this configuration, the following advantages can be obtained when soldering the electronic component. With an electronic component mounted on wiring board 24, some gap is generated between the electronic component and the land. In this condition, wiring board 24 with the electronic component is heated in the heating bath. Such soldering by heating corrects the deviation between the electronic component and the land. As a result, electronic components, detector 6 in particular, can be mounted on the land nearly without positional deviation.

Figure 4C:
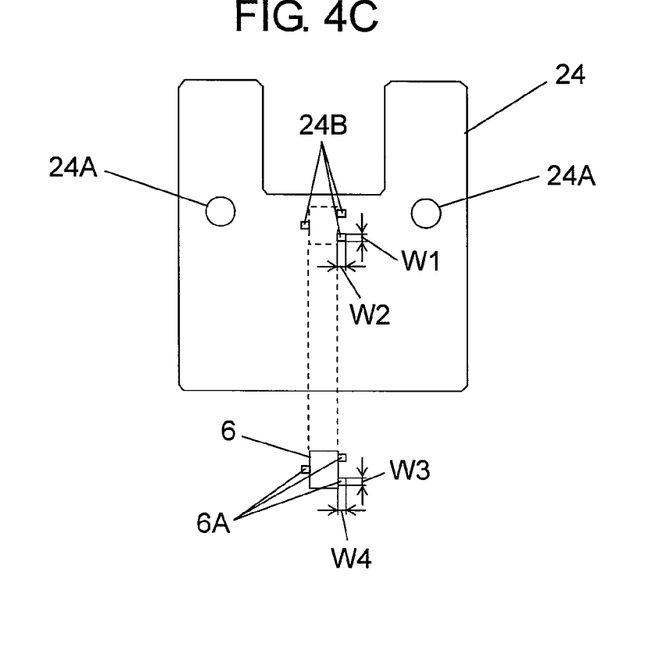
FIG. 4C is an explanatory diagram of an essential portion of a vehicle switch in the first embodiment of the present invention.

Further, by using FIG. 4C, land 24B for mounting detector 6 on the surface of wiring board 24 is described. The sizes W1, W2 of land 24B are nearly same as the sizes W3, W4 of terminal 6A of detector 6. Specifically, the sizes W1, W2 of land 24B are preferable to include the manufacturing tolerances of terminal 6A.

Also, when machining the reference hole 24A in wiring board 24, reference hole 24A is positioned based on land 24B of detector 6 or wiring pattern. In this way, there will be less positional deviation between detector 6 and reference hole 24A. It is possible to accurately solder the electronic components on wiring board 24.

As described above, wiring board 24 thus obtained is mounted on holder 23 provided with supporter 23C having restoring force. In mounting the wiring board 24 on holder 23, the position is decided by reference hole 24A, pin 23B, and supporter 23C. Positioning of detector 6 to holder 23 is indirectly performed via reference hole 24A and pin 23B. Due to this configuration, it is possible to suppress the generation of positional deviation between holder 23 and detector 6 without using any positioning tool or devices. Also the job for mounting wiring board 24 on holder 23 will be simplified.

Switch unit 31 shown in FIG. 5 will be described with reference to FIG. 2 and FIG. 3A.

Switch unit 31 includes actuator 22 fitted in holder 23 on which wiring board 24 is mounted. Actuator 22 has slide 22A and protrusion 22B. Holder 23 has guide 23A and stop portion 23D. As shown in FIG. 2, actuator 22 is fitted in holder 23 together with two springs 27. As shown in FIG. 3A, actuator 22 and holder 23 are installed so that slide 22A engages guide 23A. The engagement serves to suppress the positional deviation between actuator 22 and holder 23. Specifically, as in FIG. 3A, the deviation of actuator 22 in the right and left directions against holder 23 can be suppressed.

Figure 5:
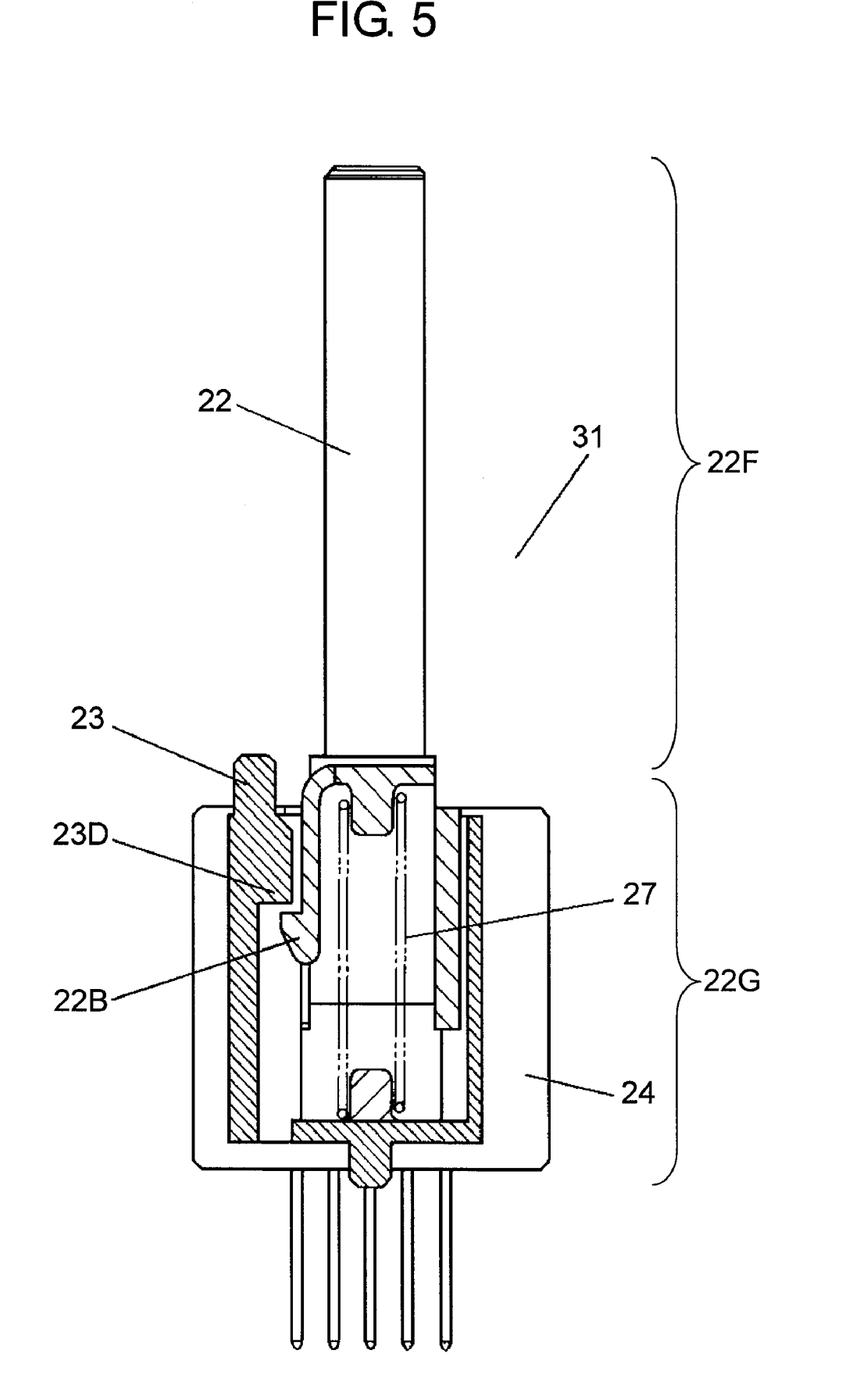
FIG. 5 is a sectional view of a switch unit in the first embodiment of the present invention.

The state of actuator 22 installed in holder 23 together with spring 27 is shown in FIG. 5. When actuator 22 is installed in holder 23, protrusion 22B receives force from stop portion 23D and flexes toward spring 27. After that, when protrusion 22B passes through beside stop portion 23D, protrusion 22B moves to the position where it is fitted to the bottom end of stop portion 23D from the other position shown in FIG. 5 due to the restoring force. As a result, actuator 22 is held by holder 23.

As is obvious in the above description, in the first embodiment, magnet 3 and detector 6 can be disposed so as to be opposed to each other by suppressing positional deviation in the following configuration.

That is, the land width for installing detector 6 on wiring board 24 is equal to the electrode width or the terminal width of detector 6 itself. Consequently, deviation generated when detector 6 is installed on wiring board 24 can be corrected when detector 6 is soldered on wiring board 24 in a heating bath or the like.

Reference hole 24A formed in wiring board 24 is positioned based on land 24B of detector 6, wiring pattern or the like. As a result, the positional deviation between detector 6 and reference hole 24A can be reduced.

Pin 23B is inserted into reference hole 24A and, by using the restoring force of supporter 23C, wiring board 24 is installed on holder 23. As shown in FIG. 4A and FIG. 4B, since wiring board 24 is pushed upward by supporter 23C, the positional relation between reference hole 24A and pin 23B is settled as specified. As a result, the positional deviation between wiring board 24 and holder 23 can be reduced.

Actuator 22 and holder 23 are assembled so that slide 22A engages guide 23A. Consequently, it is possible to prevent the generation of deviation of actuator 22 in a direction of intersecting the predetermined direction of the movement thereof. Specifically, in the sectional view of vehicle switch 30 shown in FIG. 3A, the generation of deviation in the right and left directions can be suppressed.

Thus, suppressing the positional deviation between the components, it is possible to remarkably reduce the positional deviation between detector 6 and magnet 3. Between the components is expressed with respect to the connection between components existing for detecting the positions of detector 6 and magnet 3.

In other words, by using the plurality of positioning parts, it is possible to decide the positions of magnet 3 and detector 6 opposing to each other via holder 23. Switch unit 31 is less in positional deviation of each component thereof. Switch unit 31 is housed in case 21 and the opening at the upper part of case 21 is covered with cover 28. In this case, terminal 25 connected to wiring board 24 is protruded from hole 21B formed in bottom 21A of case 21. End 22E of actuator 22 is protruded from tube 28A of cover 28. In this way, vehicle switch 30 is completed. As a result, in side the casing 32, actuator 22 and holder 23 may use the underside of cover 28 as the reference surface.

Figure 3B:
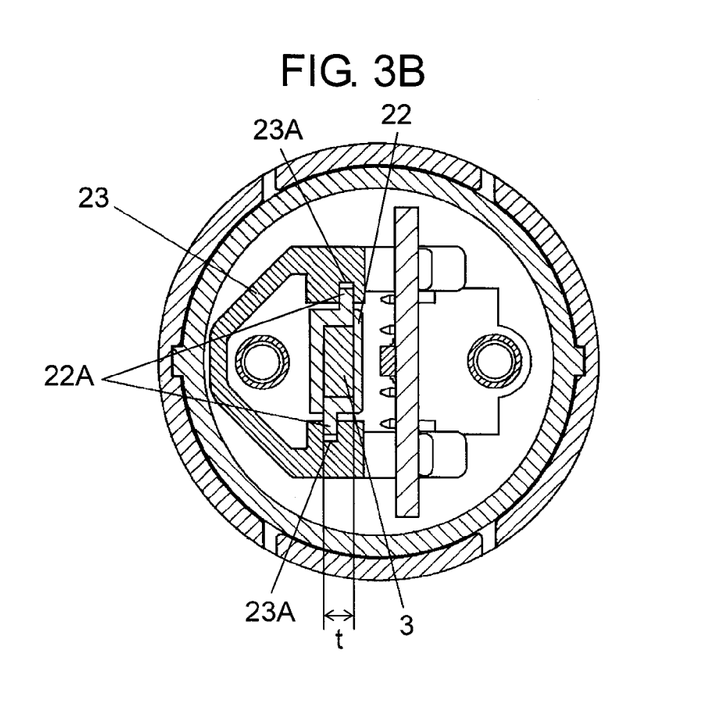
FIG. 3B is a sectional view of a vehicle switch in the first embodiment of the present invention.

In FIG. 3A, slide 22A and guide 23A are disposed in a position where they are symmetrical to actuator 22. Slide 22A and guide 23A, as shown in FIG. 3B, may be disposed in positions deviated in the right and left direction against actuator 22. Particularly, disposing slide 22A and guide 23A within the range of thickness t of magnet 3, it is possible to suppress the generation of defective rotation between actuator 22 and holder 23. As a result, positional deviation between magnet 3 and detector 6 that is generated when actuator 22 moves can be further reduced.

Also, as described above, after assembling switch unit 31 that is the main component, switch unit 31 is housed in casing 32. According to this assembling method, there is no operation performed to build small parts such as spring 27 directly into case 21. As a result, vehicle switch 30 in the first embodiment is improved in assembling convenience.

Vehicle switch 30 shown in the first embodiment is installed in a motor vehicle. For the description of the state of the switch installed, the description of FIG. 8 is to be quoted.

Figure 6:
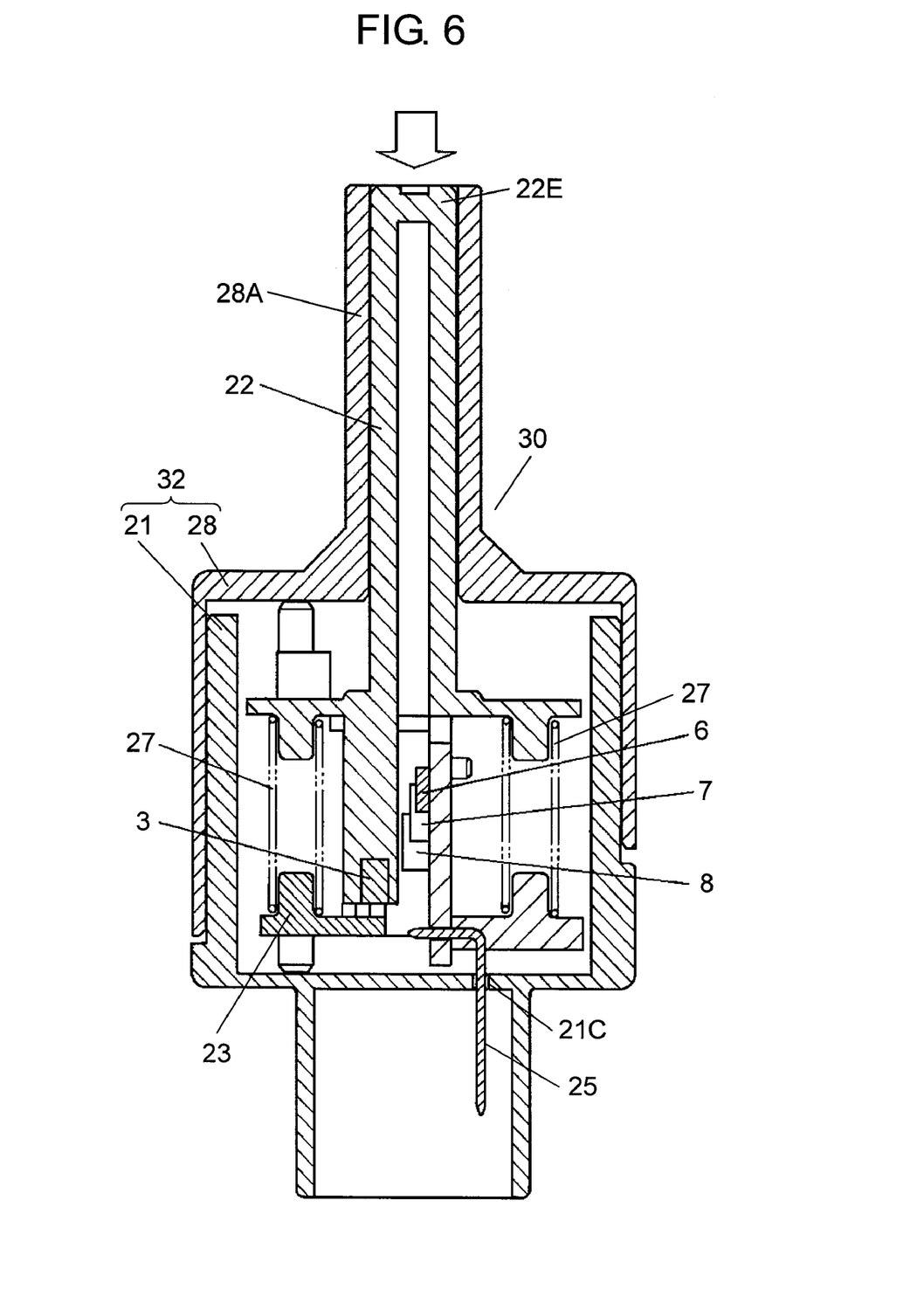
FIG. 6 is a sectional view of a vehicle switch in the first embodiment of the present invention.

As shown in FIG. 6, when brake pedal 13 is not depressed, the pressing force is applied downward to the end 22E of actuator 22. In other words, actuator 22 is in a state of being depressed downward. Magnet 3 disposed on the side surface of actuator 22 moves downward along with actuator 22. With brake pedal 13 depressed, magnet 3 is opposed to detector 6, and when brake pedal 13 is not depressed, magnet 3 is positioned far away from detector 6. As a result, the magnetism of magnet 3 detected by detector 6 becomes very weak.

Controller 8 performs the following operation in accordance with the intensity of magnetism detected by detector 6.

When the magnetism detected is higher than the specified value, controller 8 turns on the switching part 7 and turns on the stop lamp. When the magnetism detected is less than the specified value, controller 8 turns off the switching part 7 and turns off the stop lamp.

As described above, with actuator 22 depressed downward, the magnetism detected by detector 6 is very weak, that is, the magnetism becomes less than the specified value. Accordingly, controller 8 turns off the switching part 7 and turns off the stop lamp.

As shown in FIG. 8, with brake pedal 13 depressed, the inside of vehicle switch 30 becomes as described in the following state as shown in FIG. 1. When brake pedal 13 is depressed, arm 13A moves off from end 22E of actuator 22. As a result, the pressing force applied by arm 13A to actuator 22 is released, and then actuator 22 moves upward due to the restoring force of spring 9. In this case, magnet 3 disposed on the side surface of actuator 22 moves upward along with actuator 22. As a result, magnet 3 and detector 6 becomes opposed to each other, increasing the magnetism of magnet 3 detected by detector 6. In other words, the magnetism detected by detector 6 becomes higher than the specified value, and controller 8 turns on the switching part 7 and turns off the stop lamp.

As described above, in the vehicle switch 30, it is configured for magnet 3 and detector 6 that positioning is performed between relevant components for detecting the position of magnet 3 by means of detector 6. That is, through positioning performed by a plurality of times, magnet 3 and detector 6 disposed opposite to each other are less in variation of their installing positions. As a result, the movement of actuator 22 is detected with great accuracy. Because the accuracy of detecting the position of actuator 22 is high, the accuracy of controlling the switching part 7 also becomes high, thereby improving the reliability of on-off control of the stop lamp installed in the motor vehicle.

Also, in the above description, actuator 22 is configured in that actuator top 22F formed of a cylindrical shaft that moves in tube 28A is integrated with actuator bottom 22G having magnet 3. However, it may separate the actuator top 22F from the actuator bottom 22G. With actuator 22 separated, when actuator 22 is depressed, there will be no influence to actuator bottom 22G having magnet 3 even in case the cylindrical shaft of actuator top 22F is inclined in tube 28A. Because of no positional deviation between magnet 3 and detector 6, it gives rise to the reliability of vehicle switch 30.

Thus, in the first embodiment, there is provided holder 23 in case 21. Holder 23 is equipped with actuator 22 that moves in the predetermined direction and wiring board 24 having detector 6. There is provided a positioning mechanism between relevant components for detecting the positions of components such as wiring board 24 and holder, magnet 3 in particular, by means of detector 6. In this way, the positions of magnet 3 and detector 6 opposing to each other are decided. As a result, when vehicle switch 30 is assembled, magnet 3 and detector 6 become less in variation of their positions. Accordingly, vehicle switch 30 is enhanced in switching accuracy and becomes possible to attain reliable operation. Also, because of performing the positioning between component parts of vehicle switch 30, it is not necessary to use any device or tool only for the positioning purpose in the assembly work The projection and recess of each component used in the above description are allowable to be replaced with each other provided that the intended purpose can be achieved, and in any case, similar action and effect can be obtained.

Also, vehicle switch 30 described in the first embodiment is configured in that controller 8 and switching part 7 are internally disposed. The electronic circuits of controller 8 and switching part 7 are preferable to be disposed outside the vehicle switch 30. And, wiring board 24 in vehicle switch 30 is preferable to include only detector 6 and its peripheral components.

Vehicle switch 30 in the first embodiment is capable of reliable operation because the variation in position of magnet 3 and detector 6 is suppressed when they are faced to each other. Vehicle switch 30 is mainly useful for ON-OFF control of the stop lamp of a motor vehicle.

What is claimed is:

1. A vehicle switch comprising:
   a casing;
   an actuator movable in a predetermined direction with respect to the casing, the actuator having a first radial protrusion;
   a magnet fixed to the actuator;
   a detector for detecting magnetism generated from the magnet;
   a wiring board mounted with the detector and provided with a reference hole; and
   a holder fixed to the casing, the holder enabling the actuator to move in the predetermined direction and positioning the detector, the holder including a pin inserted into the reference hole of the wiring board, a supporter that contacts an edge of the wiring board such that the pin is pressed against a sidewall of the reference hole, and a second radial protrusion positioned to contact the first radial protrusion of the actuator,
   wherein the first and second radial protrusions are shaped to prevent movement of the actuator relative to the holder in a first direction, wherein one or both of the first and second radial protrusions are flexible, and are shaped to allow movement of the actuator relative to the holder in a second direction opposite the first direction, the second direction comprising a direction of insertion of the actuator into the holder, and wherein the actuator and holder are sized to prevent a positional deviation of the magnet relative to the detector.

* * * * *